United States Patent
Terasawa et al.

(10) Patent No.: US 11,415,874 B2
(45) Date of Patent: Aug. 16, 2022

(54) METHOD OF MANUFACTURING REFLECTIVE MASK BLANK, REFLECTIVE MASK BLANK, AND METHOD OF MANUFACTURING REFLECTIVE MASK

(71) Applicant: Shin-Etsu Chemical Co., Ltd., Tokyo (JP)

(72) Inventors: Tsuneo Terasawa, Joetsu (JP); Hideo Kaneko, Joetsu (JP); Yukio Inazuki, Joetsu (JP); Takuro Kosaka, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 82 days.

(21) Appl. No.: 17/003,685

(22) Filed: Aug. 26, 2020

(65) Prior Publication Data

US 2021/0080819 A1    Mar. 18, 2021

(30) Foreign Application Priority Data

Sep. 13, 2019  (JP) .............................. JP2019-166813

(51) Int. Cl.
*G03F 1/24*    (2012.01)
(52) U.S. Cl.
CPC ...................... *G03F 1/24* (2013.01)
(58) Field of Classification Search
CPC .......................................................... G03F 1/24
USPC ...................................................... 430/5, 30
See application file for complete search history.

(56) References Cited

U.S. PATENT DOCUMENTS

| | | |
|---|---|---|
| 6,235,434 B1 | 5/2001 | Sweeney et al. |
| 8,377,613 B2 | 2/2013 | Kim et al. |
| 2003/0067598 A1 | 4/2003 | Tomie |
| 2007/0172967 A1 | 7/2007 | Katagiri et al. |
| 2009/0233188 A1 | 9/2009 | Amano et al. |
| 2013/0017475 A1 | 1/2013 | Terasawa et al. |
| 2016/0004153 A1 | 1/2016 | Shoki et al. |

FOREIGN PATENT DOCUMENTS

| | | |
|---|---|---|
| JP | 6-349715 A | 12/1994 |
| JP | 2002-532738 A | 10/2002 |
| JP | 2003-114200 A | 4/2003 |
| JP | 2007-200953 A | 8/2007 |
| JP | 2013-26253 A | 2/2013 |
| JP | 2013-122952 A | 6/2013 |
| WO | WO 2014/129527 A1 | 8/2014 |

OTHER PUBLICATIONS

European Search Report for Appl. No. 20194073.1 dated Feb. 12, 2021.
Japanese Notice of Reasons for Refusal for Japanese Application No. 2019-166813, dated May 24, 2022, with an English translation.

*Primary Examiner* — Christopher G Young
(74) *Attorney, Agent, or Firm* — Birch, Stewart, Kolasch & Birch, LLP

(57) ABSTRACT

A reflective mask blank including a substrate, and a multi-layer reflection film for EUV light reflection, a protection film, and an absorber film for EUV light absorption formed on one main surface of the substrate in this order from the substrate side, and a conductive film formed on another main surface of the substrate, a coordinate reference mark is formed on the other main surface side.

4 Claims, 10 Drawing Sheets

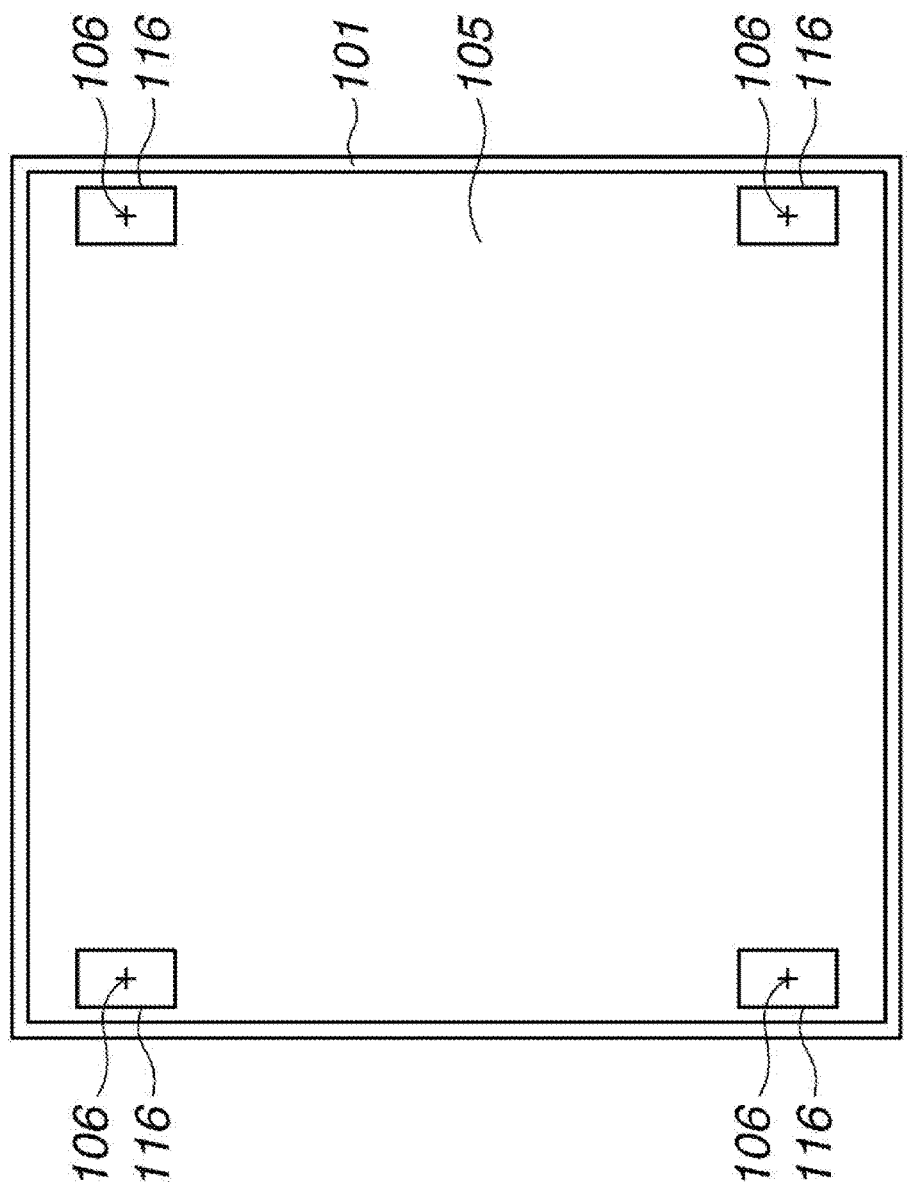

METHOD OF MANUFACTURING REFLECTIVE MASK BLANK, REFLECTIVE MASK BLANK, AND METHOD OF MANUFACTURING REFLECTIVE MASK

CROSS-REFERENCE TO RELATED APPLICATION

This non-provisional application claims priority under 35 U.S.C. § 119(a) on Patent Application No. 2019-166813 filed in Japan on Sep. 13, 2019, the entire contents of which are hereby incorporated by reference.

TECHNICAL FIELD

The present invention relates to a reflective mask blank and a method of manufacturing thereof, and particularly relates to a reflective mask blank suitable for manufacturing a reflective mask with reduced phase defects and a method for manufacturing thereof. The present invention also relates to a method of manufacturing a reflective mask with reduced phase defects using the reflective mask blank.

BACKGROUND ART

In a manufacturing process of a semiconductor device, a photolithography technique in which a circuit pattern formed on a transfer mask is transferred onto a semiconductor substrate (semiconductor wafer) through a reduction projection optical system with irradiating exposure light to the mask is used. At present, a mainstream wavelength of the exposure light is 193 nm by argon fluoride (ArF) excimer laser light. A pattern having a size smaller than the exposure wavelength can be formed finally by adopting a process called multi-patterning combining multiple exposure processes and multiple processing (etching) processes.

However, since it is necessary to form a further fine pattern, EUV lithography using, as exposure light, extreme ultraviolet (hereinafter referred to as "EUV") light having a wavelength shorter than ArF excimer laser light is promising. EUV light is light having a wavelength of about 0.2 to 100 nm, more specifically, light having a wavelength of about 13.5 nm. This EUV light has a very low transparency to a substance and cannot be utilized for a conventional transmissive projection optical system or a mask, thus, a reflection type optical elemental device is applied. Therefore, a reflective mask is also proposed as a mask for the pattern transfer. The reflective mask has a multilayer reflection film that is formed on a substrate and reflects EUV light, and a patterned absorber film that is formed on the multilayer reflection film and absorbs EUV light. On the other hand, a material before patterning the absorber film is called a reflective mask blank, and used for a material of the reflective mask.

In a manufacturing process of a reflective mask, a pattern is formed by etching the absorber film of the reflective mask blank, and then the pattern is usually inspected. When a defect is detected, the defect is repaired. However, in case of the reflective mask, a defect so-called a phase defect in which the reflectance decreases due to disorder of the structure in the multilayer reflection film exists in addition to a defect derived from the absorber film and an absorber pattern in some cases. Furthermore, it is very difficult to directly correct the phase defect in the multilayer reflection film after forming the absorber pattern.

Under the circumstances, many studies have been made on a technique for detecting a phase defect in a reflective mask blank. For example, JP-A 2003-114200 (Patent Document 1) discloses a technique utilizing a dark field inspection image as a method of detecting a phase defect inside of a multilayer reflection film by using EUV light. Further, JP-A H6-349715 (Patent Document 2) discloses a technique utilizing a bright field in X-ray microscopy as a method of detecting a phase defect inside of a multilayer reflection film by using EUV light. These methods accurately detect the phase defect in the multilayer reflection film. In particular, in the dark field detection method using EUV light described in Patent Document 1, a phase defect that is unique in a reflective mask blank having a multilayer reflection film can be detected as a bright spot signal with high sensitivity. Therefore, this is a very effective method for determining whether the phase defect is present or not after forming a multilayer reflection film.

On the other hand, as a method for finally accomplishing reduced the phase defects at the stage of manufacturing the reflective mask even if the phase defects remain in the reflective mask blank, for example, JP-A 2002-532738 (Patent Document 3) discloses a technique of improving the projection image in transferring a pattern by an exposure tool by modifying the contour of the absorber pattern, when the absorber pattern is formed from the absorber film of the reflective mask blank in which the phase defect exists without repairing the phase defect. In this method, after forming the absorber pattern, it is necessary to accurately obtain the position of the phase defect in the multilayer reflection film on the basis of coordinates of the absorber pattern. However, it is hard to pinpoint the position of the phase defect after the pattern has been formed.

Further, WO 2014/129527 A1 (Patent Document 4) discloses a technique of patterning the absorber film with avoiding the position of the phase defect by forming a reference mark on the absorber film, obtaining the position of the phase defect in the multilayer reflection film as the position of the convexo-concave of the surface of the absorber film on the multilayer reflection film and converting to positional information of the defect with respect to the reference mark, and further modifying drawing data for patterning the absorber film in accordance with the positional information of the defect. In this method, it is not necessary to engrave the reference mark into the multilayer reflection film, therefore, risk of particle generation caused by engraving the reference mark can be reduced. However, in some phase defects, disorder of the structure in the multilayer reflection film that reduces reflectance scarcely appears as the convexo-concave of the surface of the multilayer reflection film. Thus, in the inspection of the absorber film, it is hard to obtain the positional information of all phase defects with accuracy. Therefore, the reflective mask blank obtained by this method cannot be drawn the absorber pattern with avoiding all concerned phase defects, thus, the method cannot avoid the phase defects with high accuracy in forming the absorber pattern.

CITATION LIST

Patent Document 1: JP-A 2003-114200
Patent Document 2: JP-A H6-349715
Patent Document 3: JP-A 2002-532738
Patent Document 4: WO 2014/129527 A1
Patent Document 5: JP-A 2007-200953

SUMMARY OF THE INVENTION

As a method for detecting and avoiding the phase defect with high accuracy, for example, it is considered that a concave or convex mark is provided on a substrate for utilizing as a reference mark for configurating coordinate system. According to the method, it is possible to form the multilayer reflection film on the reference mark formed on the substrate and to determine the position of the phase defect in the multilayer reflection film with reference to the reference mark in the subsequent inspection of the phase defect. Further, when the absorber film is formed on the multilayer reflection film on the reference mark, and the drawing position of pattern for forming the absorber pattern is determined in accordance with the position of the phase defect in the multilayer reflection film determined with reference to the reference mark, it is possible to form the absorber pattern with avoiding the phase defect by utilizing the same reference mark.

However, when the layers constituting the multilayer reflection film are laminated on the reference mark, and further the absorber film is laminated thereon, the total thickness of the film stack usually exceeds 300 nm. In the case that the reference mark deeply buried in the films, it cannot be expected to high accuracy in determination of position. On the other hand, it is possible to engrave the reference mark in the multilayer reflection film after forming the multilayer reflection film and before forming the absorber film. However, preferably, the multilayer reflection film and absorber film are formed continuously. In particular, if the reference mark is formed in the multilayer reflection film at this stage by engraving, risk of particle defects is increased in the resulting reflective mask blank.

The present invention has been made to solve the above problems, and an object of the present invention is to provide, with respect to a defect such as a phase defect which influences to a reflective mask manufactured from a reflective mask blank, a reflective mask blank and a method of manufacturing thereof that can be accurately grasped the position of the defect in a multilayer reflection film, particularly even a finer defect, after forming the multilayer reflection film on a substrate, further after forming an absorber film on the multilayer reflection film; and to provide a reflective mask blank and a method of manufacturing thereof that can be efficiently formed an absorber pattern mitigating influence of the defect in the multilayer reflection film with avoiding the defect in high accuracy. Further, the present invention is to provide a method of manufacturing a reflective mask that can be efficiently formed an absorber pattern mitigating influence of the defect in the multilayer reflection film with avoiding the defect in high accuracy from such a reflective mask blank.

In order to solve the above-mentioned problems, the inventors have been found that, with respect to a reflective mask blank including a substrate, and a multilayer reflection film for EUV light reflection, a protection film, and an absorber film for EUV light absorption formed on one main surface of the substrate, and a conductive film formed on another main surface of the substrate, when a coordinate reference mark formed on the other main surface side, particularly on the conductive film, the coordinate reference mark is not buried into the thick films formed on the one main surface side of the substrate, and the position of a defect such as a phase defect in the multilayer reflection film can be determined with high accuracy.

Further, the inventors have been found that a reflective mask blank in which a coordinate reference mark is formed on the other main surface side is manufactured by inspecting a defect in a multilayer reflection film and an absorber film once at the stage in which the multilayer reflection film and absorber film have been formed; obtaining positional information of the detected defect on the basis of coordinates defined with reference to the coordinate reference mark and saving the positional information into a recording medium; then, forming the absorber film, inspecting a defect in the absorber film, obtaining positional information of the detected defect on the basis of coordinates defined with reference to the coordinate reference mark and saving the positional information into a recording medium. According to the method, a position of a defect can be accurately grasped in accordance with the information stored in a recording medium. Further, a reflective mask can be obtained from a reflective mask blank by forming efficiently an absorber pattern mitigating influence of the defect in the multilayer reflection film, in accordance with the positional information of the defect stored in the recording medium, with avoiding the defect such as a phase defect in high accuracy.

In one aspect, the invention provides a method of manufacturing a reflective mask blank including a substrate, and a multilayer reflection film for EUV light reflection, a protection film, and an absorber film for EUV light absorption formed on one main surface of the substrate in this order from the substrate side, and a conductive film formed on another main surface of the substrate, the method including the steps of:

(A1) forming the conductive film on said another main surface, (A2) forming a coordinate reference mark on said another main surface side, (B1) forming the multilayer reflection film and protection film on said one main surface, (B2) inspecting a defect in the multilayer reflection film and protection film formed in the step (B1), obtaining positional information of a detected defect on the basis of coordinates defined with reference to the coordinate reference mark, and saving the positional information into a recording medium, (C1) after the step (B2), forming the absorber film on the protection film, and (C2) inspecting a defect in the absorber film formed in the step (C1), obtaining positional information of a detected defect on the basis of coordinates defined with reference to the coordinate reference mark, and saving the positional information into a recording medium.

Preferably, in the step (A2), the coordinate reference mark is formed on the conductive film formed in the step (A1).

Preferably, the method further includes the step of measuring a flatness of the substrate after the step (B1) and before the step (B2) and/or the step of measuring a flatness of the substrate after the step (C1) and before the step (C2).

Preferably, when defects are detected in the step (B2), the step (B2) includes the steps of creating a processing sequence for the defects, and saving the processing sequence into the recording medium along with the positional information, typically, the processing sequence is a priority for processing the defects, the priority determined on the basis of printability of the detected defects.

In another aspect, the invention provides a reflective mask blank including a substrate, and a multilayer reflection film for EUV light reflection, a protection film, and an absorber film for EUV light absorption formed on one main surface of the substrate in this order from the substrate side, and a conductive film formed on another main surface of the substrate, wherein a coordinate reference mark is formed on the conductive film.

In a further aspect, the invention provides a set of a reflective mask blank and a recording medium, the reflective mask blank, as a main component, including a substrate, and a multilayer reflection film for EUV light reflection, a protection film, and an absorber film for EUV light absorption formed on one main surface of the substrate in this order from the substrate side, and a conductive film formed on another main surface of the substrate, a coordinate reference mark being formed on the conductive film, the recording medium being recorded positional information of a defect on the basis of coordinates defined with reference to the coordinate reference mark.

Preferably, the recording medium is further recorded a priority for processing the defects, the priority determined on the basis of printability of the detected defect.

In an even further aspect, the invention provides a method of manufacturing a reflective mask including the steps of:

preparing the set of a reflective mask blank and a recording medium, configurating coordinate system with reference to the coordinate reference mark formed on the reflective mask blank and determining positions of the defects of the reflective mask blank in the coordinate system with reference to the positional information of the defects stored in the recording medium, preparing a drawing pattern data to form an absorber pattern by patterning the absorber film, evaluating availability of processing the defect by remaining the absorber film as the absorber pattern in accordance with the priority stored in the recording medium in sequence, and forming the absorber pattern by etching and removing a part of the absorber film of the reflective mask blank so as to remain the absorber pattern at the position of the defect that has been evaluated as a processable defect in accordance with the position of the defect in the coordinate system.

Advantageous Effects of the Invention

According to the invention, with respect to a defect such as a phase defect which influences to a reflective mask manufactured from a reflective mask blank, the position of the defect in the multilayer reflection film, particularly even a finer defect, can be accurately grasped after forming the multilayer reflection film on a substrate, further after forming an absorber film on the multilayer reflection film. Further, a reflective mask blank can be manufactured by forming efficiently an absorber pattern that can mitigate influence of the defect in the multilayer reflection film with avoiding the defect in high accuracy.

BRIEF DESCRIPTION OF THE DRAWINGS

FIG. 4 is a bottom view of a reflective mask blank of which coordinate reference marks are formed on a conductive film.

DESCRIPTION OF THE PREFERRED EMBODIMENT

A reflective mask blank of the invention includes a substrate, and a multilayer reflection film for EUV light reflection, a protection film (for the multilayer reflection film), and an absorber film for EUV light absorption formed on one main surface (front side) of the substrate in this order from the substrate side, and a conductive film formed on another main surface (back side) of the substrate which is the opposite side to the one main surface. The conductive film is formed to hold electrostatically a reflective mask on a mask stage of an exposure tool. The conductive film has a thickness of normally 10 to 40 nm. In the above description, one main surface of the substrate is defined as the front side or the upper side, and another main surface is defined the back side or the lower side. However, the front and back sides or the upper and lower sides in both surfaces are defined for the sake of convenience. Two main surfaces (film forming surfaces) are one and another main surfaces, respectively. The front and back sides or the upper and lower sides can be substituted. Meanwhile, a reflective mask is formed by patterning the absorber film of the reflective mask blank to form an absorption pattern (a pattern of the absorber film).

Figure 1A:
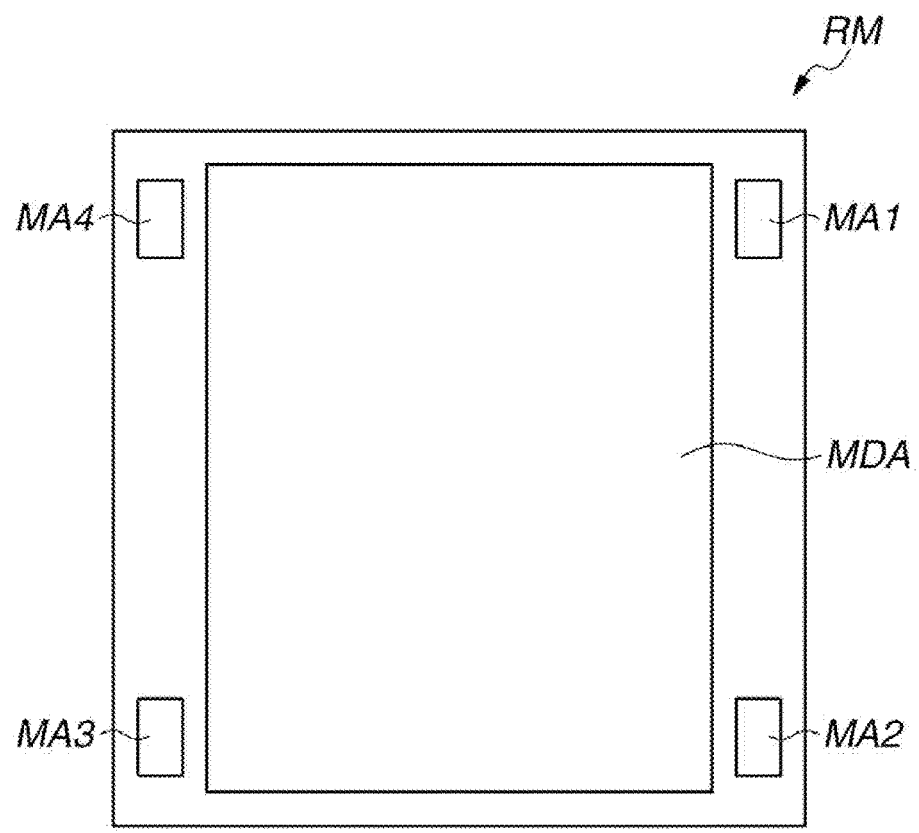
FIGS. 1A and 1B illustrate an example of a reflective mask, FIG. 1A being a plane view of an outline from the side of surface of the reflective mask on which an absorber pattern is formed, FIG. 1B being an enlarged cross-sectional view of a device pattern area of the reflective mask in FIG. 1A.
Figure 1B:
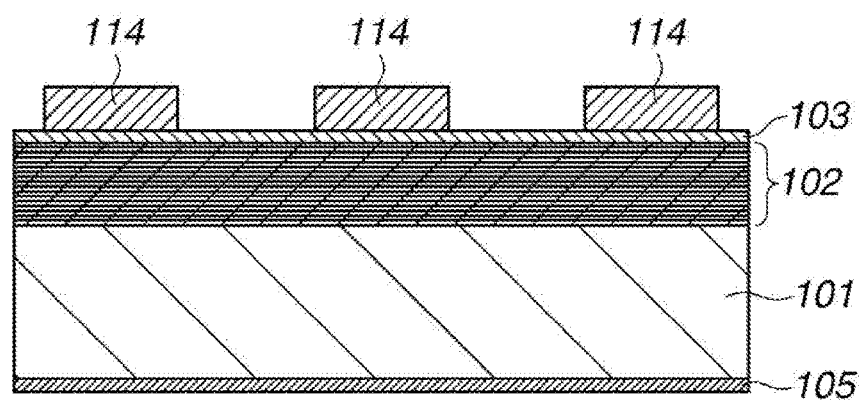

FIGS. 1A and 1B illustrate an example of a reflective mask for EUV exposure as a typical reflective mask of the invention. FIG. 1A is a plane view of an outline from the side of surface of the reflective mask on which an absorber pattern is formed, and FIG. 1B is an enlarged cross-sectional view of a device pattern area of the reflective mask in FIG. 1A. As shown in FIGS. 1A and 1B, a device pattern region MDA constituting a circuit pattern of a semiconductor integrated circuit device is formed on the predetermined position located at the central portion of one main surface side of a substrate 101 of a reflective mask RM. Alignment mark areas MA1, MA2, MA3, MA4 that include marks for alignment of the reflective mask or wafer alignment marks are formed in the peripheral portion other than the device pattern region MDA. Further, a multilayer reflection film 102 for EUV light reflection, a protection film 103, and an absorber pattern 114 for EUV light absorption are formed on one main surface of the substrate 101 in this order from the side of the substrate 101, and a conductive film 105 is formed on the other main surface of the substrate 101.

It is preferable to use a substrate composed of a low thermal expansion material and having a sufficiently flattened surface. For example, the substrate has a thermal expansion coefficient preferably within $\pm 3 \times 10^{-8}/°$ C., more preferably within $\pm 1 \times 10^{-8}/°$ C. The main surface of the substrate has a surface roughness (RMS value) of preferably up to 0.1 nm, more preferably up to 0.05 nm. Particularly, the surface roughness may be satisfied at least at a region on which an absorber pattern is formed (for example, the device pattern region MDA in FIG. 1A) in the main surface on which an absorber film is formed, preferably at the whole of the main surface on which an absorber film is formed. Such a surface roughness can be obtained by polishing the substrate.

The multilayer reflection film is a multilayer film consisting of layers composed of a material having a low refraction index and layers composed of a material having a high refraction index laminated alternatively. For EUV light having exposure wavelength of 13 to 14 nm (normally, wavelength of about 13.5 nm), for example, an Mo/Si laminated film that includes layers of molybdenum (Mo) as the material having a low refraction index, and layers of silicon (Si) as the material having a high refraction index laminated alternatively for about 40 cycles (40 layers, respectively) may be used. A thickness of the multilayer reflection film is normally about 280 to 300 nm.

The protection film is called a capping layer and is provided to protect the multilayer reflection film when the absorber pattern disposed on the protection film is formed or the absorber pattern is corrected. As a material of the protection film, for example, silicon (Si), ruthenium (Ru), or a ruthenium (Ru) compound added with niobium (Nb) and/or zirconium (Zr) may be used. A thickness of the protection film is normally about 2 to 5 nm.

The absorber pattern is a mask pattern that absorbs EUV light and is formed by patterning the absorber film. As a material of the absorber film, for example, a compound containing tantalum (Ta) as a main component, or a compound containing chromium (Cr) as a main component may is used. The absorber film may consist of a single layer or multiple layers. A thickness of the absorber film is normally about 70 to 90 nm.

The reflective mask blank may have a hard mask film on the absorber film for assisting the patterning of the absorber film. This hard mask film is usually removed after the absorber pattern is formed and is not left in the reflective mask. Further, a resist film (photoresist film) that is used for patterning the absorber film may be formed in the reflective mask blank.

Figure 2A:
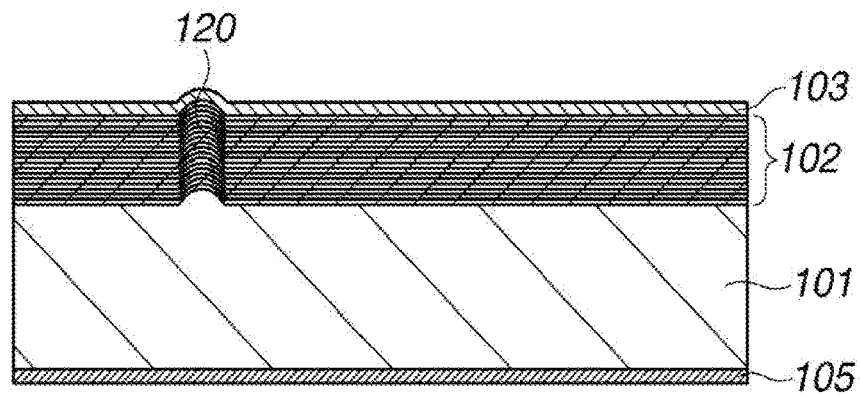
FIGS. 2A to 2C illustrate a phase defect of a reflective mask, as explanatory drawings, FIG. 2A being a cross-sectional view to explain a state of a phase defect existing in a multilayer reflection film before forming an absorber film, FIG. 2B being a cross-sectional view to explain a state of the phase defect exposed, FIG. 2C being a cross-sectional view to explain a state of the phase defect covered with an absorber pattern.
Figure 2B:
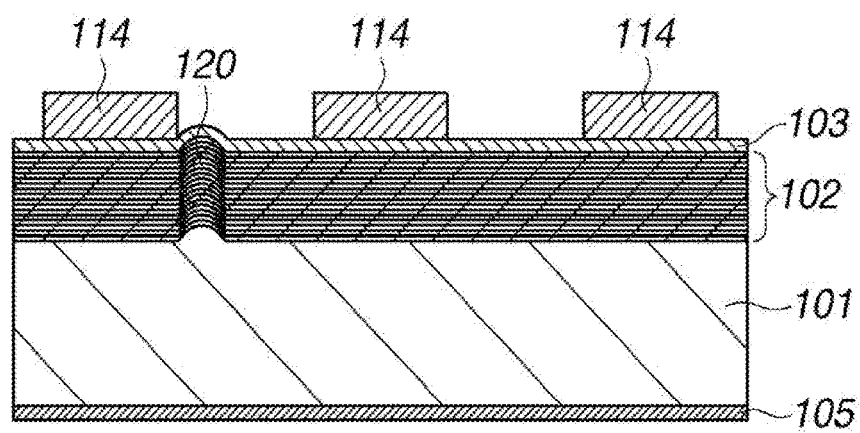
Figure 2C:
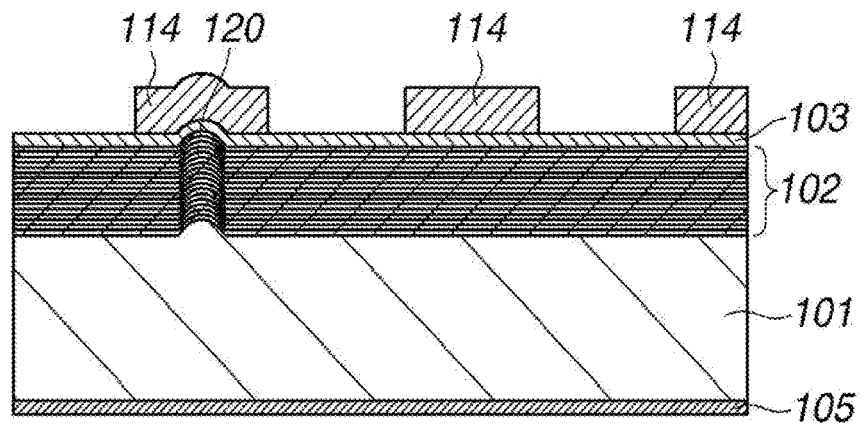

A defect so-called a phase defect in which the reflectance decreases due to disorder of the structure in the multilayer reflection film exists in some cases of a reflective mask. Hereafter, the phase defect generated in the multilayer reflection film is described. FIGS. 2A to 2C are drawings to explain a phase defect in a reflective mask for EUV light exposure. FIG. 2A is a cross-sectional view to explain a state of a phase defect existing in a multilayer reflection film before forming an absorber film, FIG. 2B is a cross-sectional view to explain a state of the phase defect exposed on the multilayer reflection film, and FIG. 2C is a cross-sectional view to explain a state of the phase defect covered with an absorber pattern.

FIG. 2A illustrates a state in which a convex phase defect 120 is formed through the multilayer reflection film 102 to the protection film 103 that are formed on the defect when the multilayer a reflection film 102 is formed on the surface of the substrate 101 since the multilayer reflection film 102 is formed on the main surface of the substrate in which a fine convex portion is present. The numeral symbol 105 represents a conductive film. Although FIG. 2A illustrates the case that a fine convex portion is present on the main surface of the substrate 101, when a fine concave portion is present on the main surface of the substrate 101, a concave phase defect 120 will be formed. Even if fine convex or concave portion is present on the main surface of the substrate 101, when the convex shape or the concave shape is gently flattened by smoothing effect in the process of forming respective layers of the multilayer reflection film 102, it may be hard to appear a convex or concave shape on the finally obtained surface of the multilayer reflection film 102 or protection film 103 in some cases. However, even in such a case, if a fine convex or concave shape portion is present in the multilayer reflection film 102, the portion acts as a phase defect that generates a certain phase shift to reflected light and reduces reflectance.

When a reflective mask blank is manufactured by forming the absorber film on the protection film 103 in the state in which the phase defect 120 is present as shown in FIG. 2A, and then, forming the absorber pattern by patterning the absorber film, if the exposed phase defect 120 is present between the adjacent absorber patterns 114, as shown in FIG. 2B, and the height of the convex portion or the depth of the concave portion is, for example, at least about 2 to 3 nm, phase of the reflected light is disturbed and reflectance is decreased, and thus, a defect appears in a pattern projection image. On the other hand, when the phase defect 120 is covered with the absorber pattern 114, and the reflectance of the phase defect 120 portion is sufficiently low, a defect does not appear in projection image of the pattern of the reflective mask. Accordingly, in manufacturing a reflective mask, a defect in a pattern projection image caused by a phase defect can be avoided when a circuit pattern is formed so as to be covered the portion at which the phase defect is present with an absorber pattern. For the purpose, it is important that the position (coordinates) of the phase defect existing in the reflective mask blank can be accurately determined. Further, it is important that the position (coordinates) of the phase defect can be accurately grasped when the absorber film is patterned, and the position corresponds to the coordinates of the drawing pattern for forming the absorber pattern.

In the reflective mask blank of the invention, a coordinate reference mark is formed on the other main surface side (back side) of the substrate which is the opposite side to the one main surface side (front side) on which a multilayer reflection film, a protection film and an absorber film are formed. The coordinate reference mark is a reference (coordinate reference) on a two-dimensional coordinate or in a three-dimensional coordinate for determining the position of a specific location such as a location at which a defect exists in a reflective mask blank or a reflective mask obtained from the reflective mask blank. Thus, the coordinate reference mark is formed normally at least two positions, preferably at least three positions, more preferably at least four positions. The coordinate reference mark may have a convex shape. However, a concave shape is convenient and preferable in engraving on a substrate or a film to form the mark. Particularly, in case that the other main surface side is an attracted surface for applying an electrostatic chuck, the coordinate reference mark is more preferably formed to a concave shape.

Figure 3A:
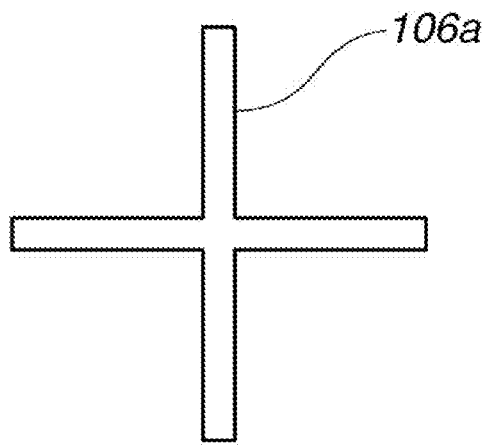
FIGS. 3A to 3C illustrate examples of planar shape of coordinate reference mark, FIGS. 3A, 3B and 3C being a cross mark, a lengthwise line mark and a crosswise line mark, respectively.
Figure 3B:
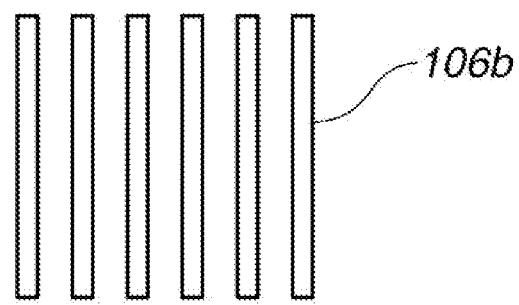
Figure 3C:
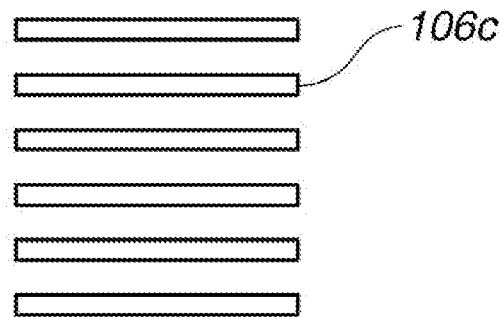

A planer shape of the coordinate reference mark is not particularly limited as long as its position can be detected by inspection light of an optical inspection tool. A cross mark 106a as shown in FIG. 3A, a lengthwise line mark 106b consisting of a plurality of spaced lines (six lines in this case) pattern as shown in FIG. 3B, and a crosswise line mark 106C consisting of a plurality of spaced lines (six lines in this case) pattern as shown in FIG. 3C are exemplified. Dimensions of the mark are not particularly limited. For example, the width may be 50 nm to 10 µm, and the length may be 50 to 200 µm.

In the reflective mask blank of the invention, the coordinate reference mark is formed preferably on the conductive film. Normally, a conductive film is formed on the other main surface side of the substrate so that an electrostatic chuck can be applied to the reflective mask when the reflective mask obtained from the reflective mask blank is loaded on an exposure tool. The coordinate reference mark may be formed directly on the substrate. However, it is advantageous to form the coordinate reference mark by processing the conductive film in view of processability of the coordinate reference mark. In addition, when the reflective mask is loaded on the exposure tool, even if the coordinate reference mark is formed on the conductive film, the function of the conductive film is not impaired. It is an advantage of forming the coordinate reference mark on the conductive film. A concave coordinate reference mark is normally formed on the conductive film by engraving a part of the conductive film, particularly a part of the outer periphery of the conductive film. Generally, the coordinate reference mark is not used for loading the reflective mask on the exposure tool.

FIG. 4 is a bottom view of a reflective mask blank in which coordinate reference marks are formed on a conductive film. In this case, the conductive film 105 is formed on the other main surface side of the substrate 101, and four concave coordinate reference marks 106 that are formed by engraving are formed within each of portions in the outer periphery of the conductive film 105 (particular, within each of four mark forming areas 116 near the four corners in this case).

The coordinate reference mark formed on the side opposing to the side which will be formed a circuit pattern is utilized as a common reference for a reference of position for inspection of a defect such as a phase defect existing in a multilayer reflection film, a reference of position for drawing an absorber pattern, a reference of position for defect inspection, and other references without laminating layers for forming the circuit pattern such as a multilayer reflection film, a protection film, an absorber film, and other films on the coordinate reference mark. In addition, since a thick film is not laminated on the coordinate reference mark with deeply burying the coordinate reference mark in the films, high accuracy can be obtained in determining the position. Further, unlike a method of forming the absorber film after forming the coordinate reference mark on the multilayer reflection film or protection film, since the coordinate reference mark is formed on the side opposing to the side which will be formed a circuit pattern. Thus, it is not needed to conduct processing of the coordinate reference mark that has a risk of generating particles after the multilayer reflection film or protection film is formed.

Next, a method for manufacturing the reflective mask blank of the invention will be described. In the invention, the reflective mask blank is suitably manufactured by a method including the respective steps of:

(A1) forming the conductive film on said another main surface, (A2) forming a coordinate reference mark on said another main surface side, (B1) forming the multilayer reflection film and protection film on said one main surface, (B2) inspecting a defect in the multilayer reflection film and protection film formed in the step (B1), obtaining positional information of a detected defect on the basis of coordinates defined with reference to the coordinate reference mark, and saving the positional information into a recording medium, (C1) after the step (B2), forming the absorber film on the protection film, and (C2) inspecting a defect in the absorber film formed in the step (C1), obtaining positional information of a detected defect on the basis of coordinates defined with reference to the coordinate reference mark, and saving the positional information into a recording medium.

Figure 5A:
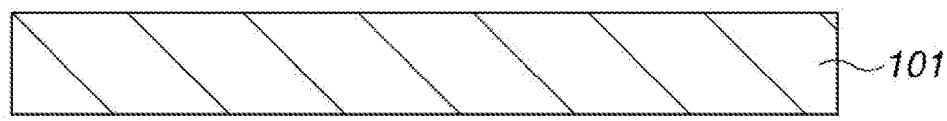
FIGS. 5A to 5E are diagrams to explain each step of manufacturing a reflective mask blank of the invention, FIG. 5A being a cross-sectional view of a substrate, FIG. 5B being a cross-sectional view of a state where a conductive film is formed, FIG. 5C being a cross-sectional view of a state where coordinate reference marks are formed on the conductive film, FIG. 5D being a cross-sectional view of a state where a multilayer reflection film and a protection film are formed, FIG. 5E being a cross-sectional view of a state where an absorber film is formed.
Figure 5B:
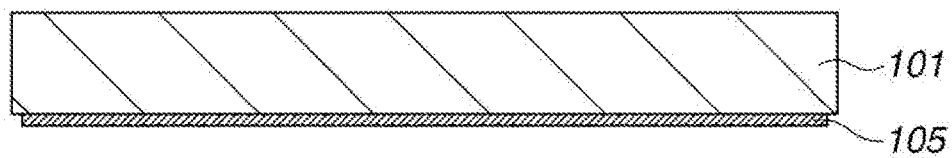
Figure 5C:
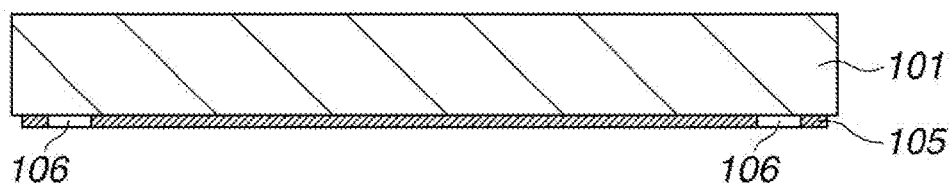
Figure 5D:
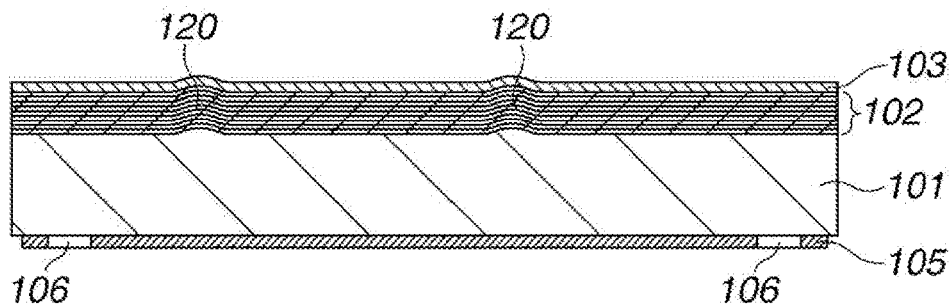
Figure 5E:
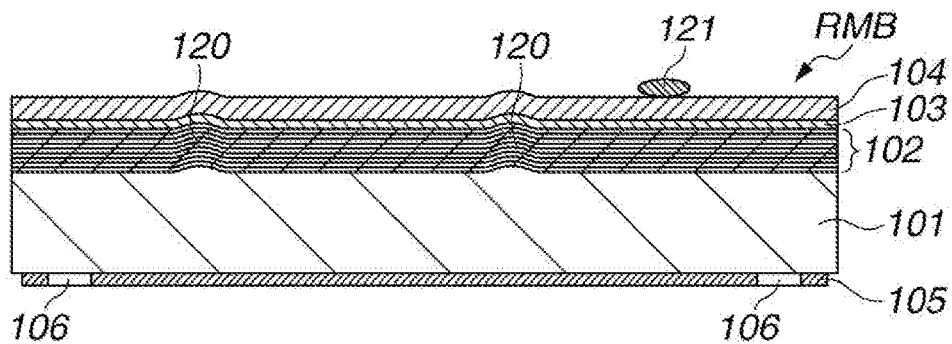

This method is concretely described with reference to the drawings. FIGS. 5A to 5E are diagrams to explain each step of manufacturing the reflective mask blank of the invention. FIG. 5A is a cross-sectional view of a substrate. FIG. 5B is a cross-sectional view of a state where a conductive film is formed on the other main surface of the substrate. FIG. 5C is a cross-sectional view of a state where coordinate reference marks are formed on the conductive film. FIG. 5D is a cross-sectional view of a state where a multilayer reflection film and a protection film are formed on one main surface of the substrate in the order. FIG. 5E is a cross-sectional view of a state where an absorber film is formed on the protection film.

In the step (A1), a substrate 101 is prepared as shown in FIG. 5A. As the substrate 101, a substrate having one and another main surfaces that have a predetermined surface roughness is prepared. Next, as shown in FIG. 5B, a conductive film 105 is formed on the other main surface of the substrate 101.

In the step (A2), a coordinate reference mark is formed on the other main surface side. In the case shown in FIG. 5C, the coordinate reference marks are formed at predetermined positions in the outer periphery of the conductive film 105. The coordinate reference mark can be formed by etching and removing a part of the conductive film 105. As a shape of the coordinate reference mark, the same shapes of alinement marks or fiducial marks commonly-used in reflective masks may be applied. Particularly, it is necessary to keep one main surface of the substrate clean after forming the conductive film and the coordinate reference mark. Thus, the substrate may be cleaned after forming the conductive film or the coordinate reference mark, if required. Even if the one main surface of the substrate has been contaminated while forming the coordinate reference mark, the surface of the substrate itself is easy to be cleaned up by cleaning process. So, the steps (A1) and (A2) are preferably conducted before the step (B1).

In the step (B1), a multilayer reflection film 102 and a protection film 103 are formed on one main surface of the substrate 101, as shown in FIG. 5C. The multilayer reflection film and protection film can be formed, respectively, by an ion beam sputtering method, a CD sputtering method or an RF sputtering method. FIG. 5C illustrates an example where convex phase defects 120 are formed in the multilayer reflection film 102 and protection film 130.

In the step (B2), the defect in the multilayer reflection film 102 and protection film 103 is inspected, positional information of the detected defect (the phase defect in this case) on the basis of coordinates defined with reference to the coordinate reference mark 106 is obtained, and the positional information is saved into a recording medium. A concrete method of inspecting the defect in this step is described later. In this defect inspection, it is preferable to obtain information of the detected signal level of the defect along with positional information, and to save them into the recording medium. In addition, a step of measuring a flatness of the substrate may be included after the step (B1) and before the step (B2). A flatness can be measured, for example, by utilizing function for adjusting focus in an optical system for detecting the coordinate reference mark, of the inspection tool shown in FIG. 6 and described later.

In the step (C1), an absorber film 104 is formed on the protection film 103, as shown in FIG. 5E. The absorber film can also be formed by an ion beam sputtering method, a CD sputtering method or an RF sputtering method. In FIG. 5E, the absorber film 104 has a convex shape at the position of the phase defect 120 derived from the convex phase defect 120 formed in the multilayer reflection film 102 and protection film 103. Besides, in this case, FIG. 5E illustrates also an example where a particle 121 is attached on the surface of the absorber film 104.

In the step (C2), a defect in the formed absorber film in which a phase defect in the multilayer reflective film, a particle defect, and other defects are included is inspected, positional information of the detected defect on the basis of coordinates defined with reference to the coordinate reference mark 106 is obtained, and the positional information is saved into a recording medium. The defect inspection may be conducted by a conventionally known method in this step. For example, as shown in FIG. 5E, when a particle is attached on the surface of the absorber film, the defect is detected as a particle defect. The positional information of the detected defect is obtained, and saved into the recording medium. In addition, a step of measuring a flatness of the substrate may be included after the step (C1) and before the step (C2).

A step of forming a resist film (photoresist film) on the absorber film may be included after the step (C2). According to this method, a reflective mask blank RMB as shown in FIG. 5E is obtained, and a reflective mask, for example, as shown in FIG. 2C, is manufactured by patterning the absorber film of the reflective mask blank.

Figure 6:
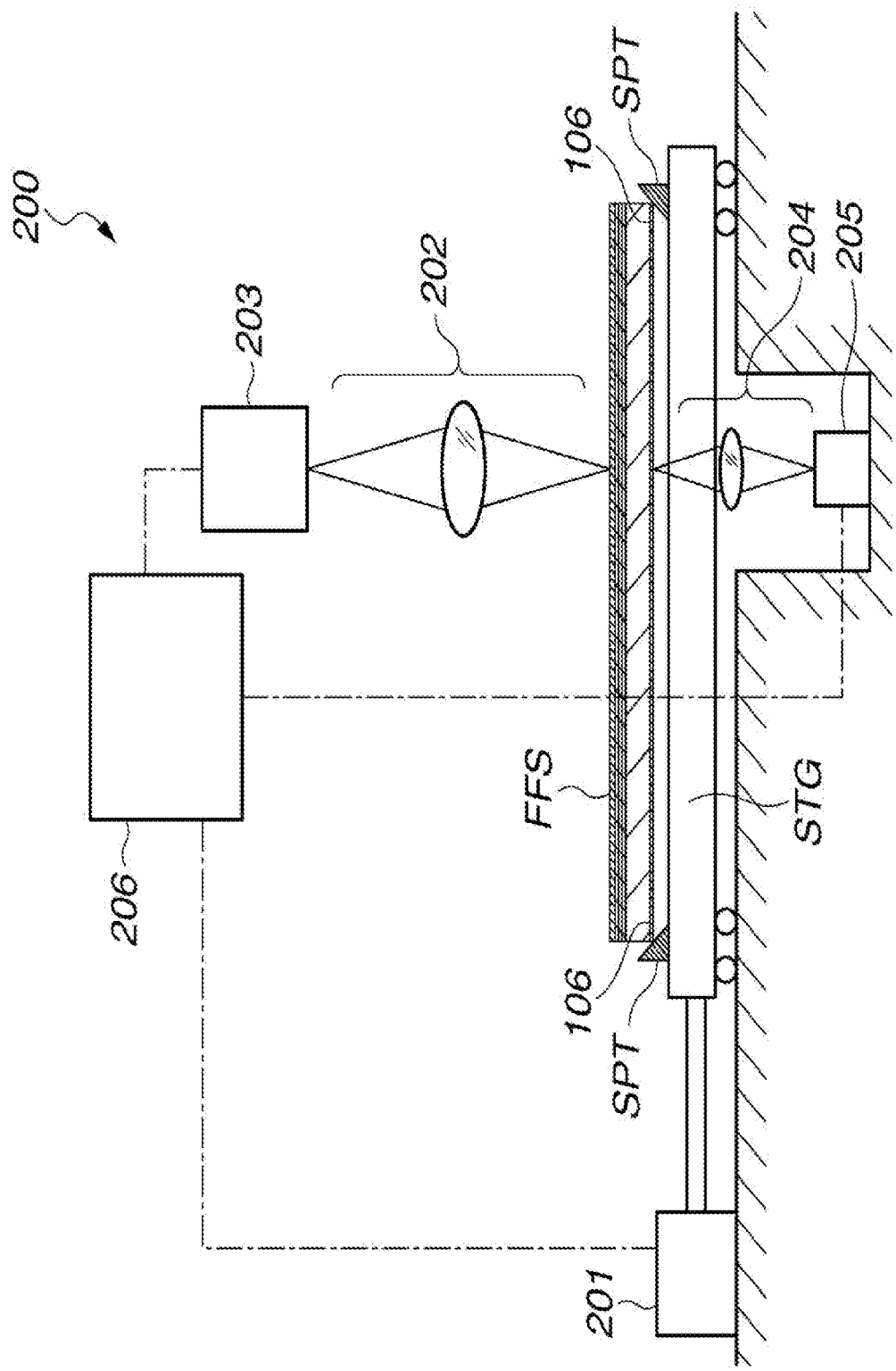
FIG. 6 is a conceptual diagram of an inspection tool including an optical system for detecting a defect of a film and an optical system for detecting a coordinate reference mark.

Next, a suitable defect inspection method for the steps of (B2) and (C2) is described. FIG. 6 is a conceptual diagram of an inspection tool including an optical system for detecting a defect of a film formed on one main surface side of a substrate (a defect of the multilayer reflection film, particularly a phase defect in the step (B2), or a defect of the absorber film in the step (C2)), and an optical system for detecting a coordinate reference mark on another main surface side of the substrate. The inspection tool 200 includes a supporting member SPT for supporting a film-formed substrate FFS, a mask stage STG, a stage driving unit 201, an optical system for defect inspection 202, an imaging and controlling unit for the defect inspection 203, an optical system for detecting a coordinate reference mark 204, an imaging and controlling unit for detecting the coordinate reference mark 205, and a control device 206 which controls the whole of the defect detection. In the steps (B2) and (C2), an object of the film-formed substrate FFS is usually an intermediate product in process of manufacturing a reflective mask blank, or a reflective mask blank. However, an intermediate product in process of manufacturing a reflective mask, or a reflective mask may be applied as the object.

The optical system for defect inspection 202 and the optical system for detecting a coordinate reference mark 204 include an illumination optical system for irradiating inspection light and a system for focusing, respectively, although not shown in the drawing. The inspection light used in the optical system for defect inspection 202 may be inspection light having a wavelength of 190 to 540 nm which is applied usually, and further EUV light having a wavelength of 13 to 15 nm may also be applied. When EUV light is applied, a reflection-type mirror is used in the illumination optical system and the optical systems for inspection. As an optical system for detecting a coordinate reference mark formed on another main surface side of the substrate, for example, an optical system disclosed in JP-A 2007-200953 (Patent Document 5) for a wafer substrate as an object is known, and it is also possible to use this optical system.

In the case of the inspection tool shown in FIG. 6, the optical system for defect inspection 202 and optical system for detecting a coordinate reference mark 204 are arranged so that the axes of the lens are coaxially aligned on the same axis. When a defect of the film is detected by the optical system for defect inspection 202 after detecting the coordinate reference mark 106 formed on another main surface side of the film-formed substrate FFS, the position of the defect can be obtained as positional information on the basis of the coordinates determined with reference to coordinate reference mark, and the obtained positional information is saved or recorded into a recording medium. Further, information of the detected signal level of the defect may be obtained along with the positional information of the defect. In this case, the information of the detected signal level of the defect may be saved or written along with the positional information of the defect into the recording medium. The coordinate system may be either a two-dimensional coordinate system or a three-dimensional coordinate system.

In particular, when a defect, specifically a phase defect is detected, it is preferable to create a processing sequence for the defects, and to save or recorded the processing sequence into the recording medium along with the positional information. The processing sequence may be a priority for processing the defects that is determined on the basis of printability of the detected defects. For example, in the step (B2), when a phase defect is detected in a multilayer reflection film, influence of reduction in reflectance (printability of the defect in use of the reflective mask) caused by the phase defect in the multilayer reflection film can be evaluated from the information of the detected signal level of the phase defect. And, processing sequence may be created so that the defect evaluated as a defect having a large influence of the reduction in reflectance is given a prior order. In this case, this processing sequence may be a priority for processing defects, for example, a priority to cover the defect with an absorber pattern by patterning the absorber film to form the absorber pattern in manufacturing a reflective mask.

In the case of the inspection tool shown in FIG. 6, the support member SPT does not have a structure in which the film-formed substrate FFS is fixed with pressing. The film-formed substrate FFS is simply supported by the support member SPT, and the film-formed substrate FFS is not applied any pressure that deforms its shape.

Figure 7:
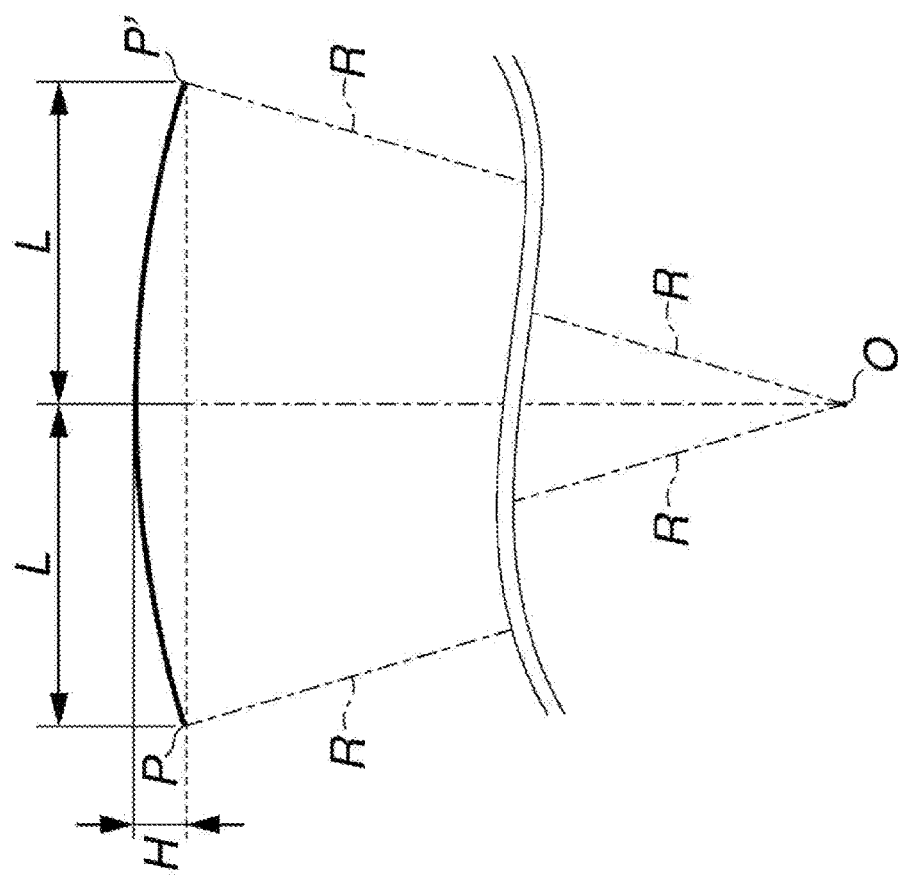
FIG. 7 is an explanatory drawing illustrating a state of warpage or deflection of main surface of a substrate by a quadric curve.

A substrate is warped due to stress by forming a film such as a multilayer reflective film, a protection film, an absorber film, and other films. When the film-formed substrate is simply supported as the inspection tool shown in FIG. 6 and inspected, the substrate has a deflection and is inspected in a state having the deflection. In many cases, the shape of warpage or deflection can be represented, for example, by a quadric curve as shown in FIG. 7. In FIG. 7, the curve P-P' illustrates as a state of main surface of a substrate having warpage or deflection. The symbol "L" represents a distance from one of the opposing corners of the substrate to the center of the substrate (i.e., "2×L" corresponds to a distance of a diagonal line), and the symbol "H" represents an amount (height) of warpage or deflection at the center of the substrate. From these values, a radius of curvature R (a distance from the symbol "0" represented as the center of curvature) can be calculated under assuming the shape of the main surface of the substrate as a quadric surface. The distance L and the height H may be obtained by measuring a flatness of the substrate.

Figure 8:
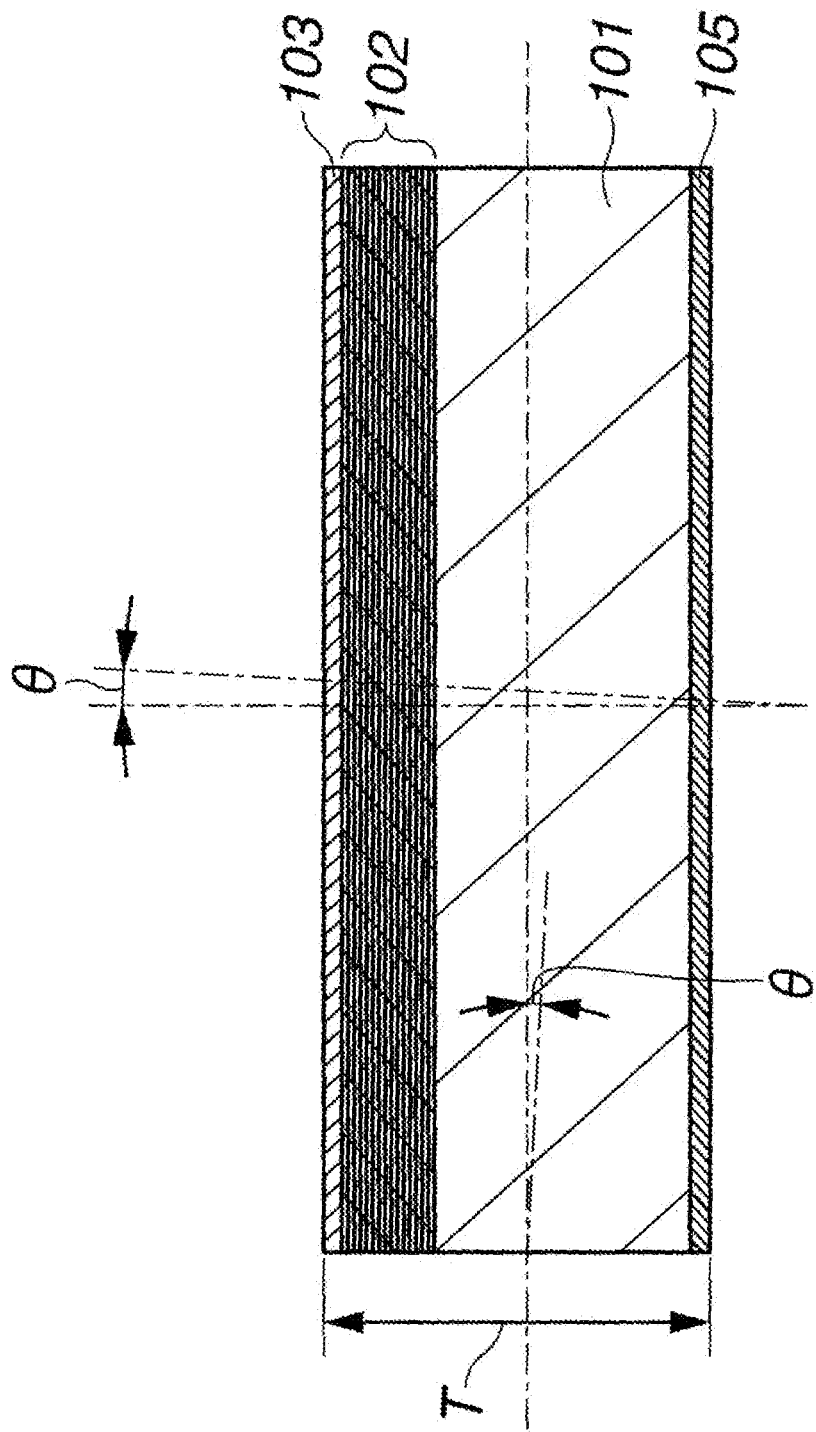
FIG. 8 is a cross-sectional view illustrating a state of a substrate on which a film is formed is locally inclined by an angle θ.

In the defect inspection, local inclination of the film-formed substrate causes positional difference between one and another main surfaces of the substrate. Therefore, it is preferable to grasp warpage or deflection of the substrate on which the multilayer reflection film, the protection film, the absorber film, and other films formed, and to correct influence of the local inclination derived from the warpage or deflection. FIG. 8 is a cross-sectional view illustrating schematically a state of a substrate on which a film is formed is locally inclined by an angle θ. In this case, when the substrate 101, the multilayer reflection film 102, the protection film 103 and the conductive film 105 have the total thickness of "T", a positional difference represented "T×sin θ" arises in the coordinates between the one and the other main surfaces. Thus, the difference may be corrected. The angle θ may be calculated from the shape of warpage or deflection drawn by a quadric surface, and the approximate position of the detected defect. Besides, the angle θ may be directly calculated based on the method described in JP-A 2007-200953 (Patent Document 5).

The correction value can be calculated, for example, as follows. When a radius of curvature of a quadric surface, and coordinates of the defect with respect to original point (x=0, y=0) in a two-dimensional coordinate system defined with reference to the coordinate reference marks are, respectively, "R" and "x, y", a correction value "Δx" in x-direction and a correction value "Δy" in y-direction attributed from inclination of the angle θ are, respectively, Δx=(T/R)x and Δy=(T/R)y. When such correction is applied, information for correcting the position of the defect may be saved or recorded into a recording medium along with the positional information of the defect.

Positional information of the defect in a reflective mask blank is saved or recorded into a recording medium along with information of the detected signal level of the defect, a processing sequence (priority), information for correcting the position of the defect, and others. The reflective mask blank of the invention may be provided as a set of a reflective mask blank, as a main component, and a recording medium. According to the reflective mask blank combined with the recording medium, when a reflective mask is manufactured from the reflective mask blank, in patterning the absorber film, position and processing sequence of the defect can be determined from the information saved or recorded in the recording medium.

Next, a method of manufacturing a reflective mask is described. An example of the method of manufacturing the reflective mask by patterning an absorber film of a reflective mask blank is described with reference to the flowchart shown in FIG. 9.

First, a reflective mask blank and recording medium or a set including a reflective mask blank and a recording medium is prepared (Step S101). The reflective mask blank, as a main component, includes prescribed films formed on one and another main surface of a substrate, and a coordinate reference mark formed on the other main surface of the substrate. The recording medium stores or records positional information of a defect such as a phase defect on the basis of coordinates defined with reference to the coordinate reference mark, information of the detected signal level of the defect, a processing sequence (priority), information for correcting the position of the defect, and others. Examples of the recording medium include a medium recording information electrically or magnetically. The recording medium may be a paper medium in which information is written. Next, coordinate system is configured with reference to the coordinate reference marks formed on the reflective mask blank, and position of the defect in the reflective mask blank is determined in the coordinate system with reference to the positional information of the defect stored in the recording medium (Step S102). The coordinate system may be either a two-dimensional coordinate system or a three-dimensional coordinate system.

Next, a drawing pattern data to form an absorber pattern by patterning the absorber film is prepared (Step S103). Next, position of the drawing pattern is compared with the position of the defect, and availability of processing the defect by remaining the absorber film as an absorber pattern, typically, possibility of covering the defect with the absorber pattern is evaluated in accordance with the priority stored in the recording medium in sequence (Step S104). At this stage, if the evaluation decides that there is no defect that can be processed or the number of defects is relatively small, the entire drawing pattern to form the absorber pattern may be rearranged by moving in the predetermined direction. Then, the procedure is returned to Step S103, and the drawing position of the drawing pattern can be optimized by conducting Step S104 again. By this way, it is possible to optimize the drawn position of the drawing pattern so as to maximize the coverage of the defect having a high priority that have a high fatality and should be preferentially covered with the absorber pattern among the defects. In addition, influence of the local inclination derived from the warpage or deflection of the substrate may be also corrected for the drawn position of the drawing pattern as same in correction of the defect position with respect to the local inclination of the film-formed substrate.

The drawing pattern may be set on the basis of coordinate defined with reference to the coordinate reference mark. For the purpose, a tool for writing the drawing pattern preferably has function that detect the coordinate reference mark. If the drawing tool does not have the function for detection of the coordinate reference mark, or the coordinate reference mark cannot be detected, preliminarily, an auxiliary mark may be formed on the periphery of the absorber film by the drawing tool to utilize the auxiliary mark for the setting. A fiducial mark may be utilized as the auxiliary mark. In this case, coordinate system defined via the auxiliary mark with reference to the coordinate reference mark may be configured by obtaining the relationship between the coordinate reference mark and the auxiliary mark by, for example, the inspection tool shown in FIG. 6.

Next, the absorber pattern is formed by patterning the absorber film (Step S105). In particular, the absorber pattern may be formed by etching and removing a part of the absorber film of the reflective mask blank so as to remain the absorber pattern at the position of the defect that has been evaluated as a processable defect in accordance with the position of the defect in the coordinate system.

By this manufacturing method of the reflective mask, the absorber pattern can be formed so that influence of the defect (phase defect) is mitigated as much as possible, and a reflective mask having a controlled influence of the defect can be manufactured. Further, when the reflective mask can be manufactured by such a method, it is not necessarily to completely eliminate a defect such as a phase defect of the reflective mask blank to zero. Therefore, by the method, yield of the reflective mask blank that can be used for manufacturing the reflective mask is effectively increased, and the reflective mask blank can be provided with good productivity.

The reflective mask obtained by patterning the absorber film to form the absorber pattern is normally provided to inspection of pattern defect of the absorber pattern (Step S106). If needed, repair or shape correction of the absorber pattern is conducted. A conventionally known method may be applied for these, and the coordinates defined with reference to the coordinate reference mark of the invention are preferably utilized in the inspection of defect of the absorber pattern, or the repair or shape correction of the absorber pattern.

Figure 9:
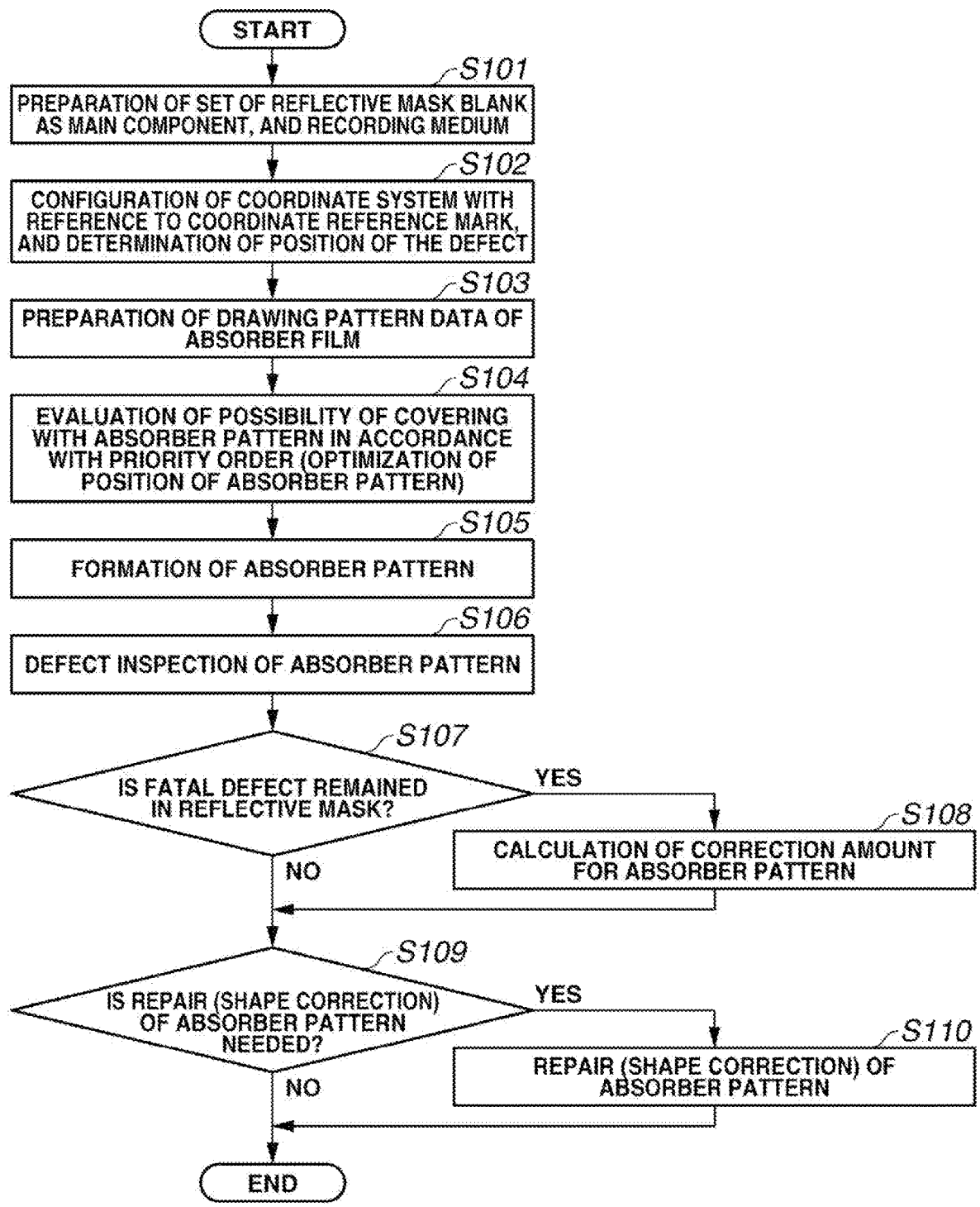
FIG. 9 is a flowchart of an example of a method of manufacturing a reflective mask by patterning an absorber film of a reflective mask blank.

After the inspection of pattern defect of the absorber pattern, for example, as shown in FIG. 9, possibility of remaining a fatal defect, particularly a fatal phase defect, in the reflective mask is evaluated with reference to the inspected defect information of the absorber pattern, positional information of the defect stored in the recording medium, and positional information of the drawing pattern (Step S107). Next, if the fatal defect is remained, correction amount is calculated to correct the shape of the absorber pattern (Step S108), and need for repairing of the absorber pattern in accordance with the inspected defect information of the absorber pattern, and need for correcting the shape of the absorber pattern for the fatal defect are evaluated (Step S109). On the other hand, when it is evaluated in Step S107 that the absorber pattern is free of a fatal defect, Step S109 is directly conducted (without Step S108), and need for repairing of the absorber pattern in accordance with the inspected defect information of the absorber pattern is evaluated. Next, when it is evaluated that repairing of the absorber pattern in accordance with the inspected defect information of the absorber pattern, or correcting the shape of the absorber pattern for the fatal defect is necessary, the repair or shape correction of the absorber pattern is conducted (Step S110).

Figure 10A:
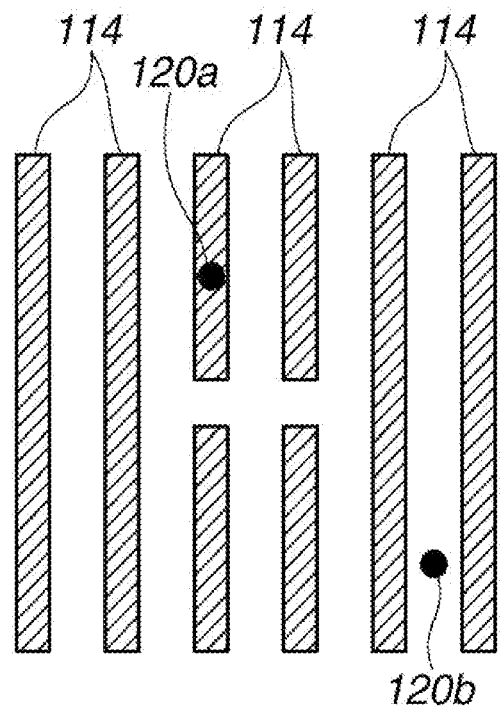
FIGS. 10A and 10B are, respectively, conceptual diagrams illustrating an absorber pattern of a reflective mask and positions of phase defects existing in a multilayer reflection film.
Figure 10B:
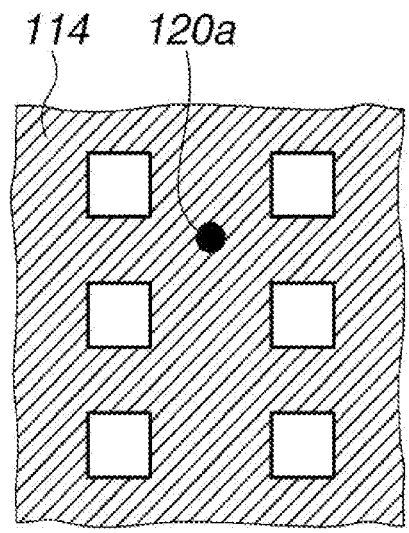

Here, the shape correction of the absorber pattern is described with illustrating the absorber pattern of the reflective mask and positions of phase defects existing in a multilayer reflection film. FIGS. 10A and 10B are, respectively, conceptual diagrams illustrating an absorber pattern of a reflective mask and positions of phase defects existing in a multilayer reflection film. In both FIGS. 10A and 10B, phase defects 120a having a high priority are completely covered with the absorber pattern 114, the phase defect 120a having a high priority is in a state where the phase defect is not projected as a defect when the reflective mask is used. On the other hand, for example, the phase defect 120b that has a low priority and has not been covered with the absorber pattern 114 may remain in some cases. If the number of defects is large, probability of remaining the phase defect 120b that is not covered with the absorber pattern 114 increases. Further, if a positional error is caused in forming the absorber film pattern, the phase defect 120b that is not covered with the absorber pattern 114 may remain.

When the remaining phase defect is a phase defect existing between adjacent absorber patterns, the influence in projecting mask pattern by an exposure tool can be mitigated, for example, by the method disclosed in JP-A 2002-532738 (Patent Document 3), in particular, the method of correcting the contour of the absorber pattern adjacent to the phase defect.

EXAMPLES

Examples of the invention are given below by way of illustration and not by way of limitation.

Example 1

First, a substrate was prepared and a conductive film (20 nm thick) composed of Cr-based material was formed on another main surface of the substrate. Next, a cross mark shown in FIG. 3A was formed in each of the four mark-formation areas of the conductive film shown in FIG. 4 as a coordinate reference mark. The coordinate reference mark was a concave mark having a depth of 20 nm formed by etching and removing the conductive film by means of a photolithography. The width of the line was 2 μm, and the lengths of the crossed lines were 100 μm, respectively.

Next, after cleaning the substrate, a multilayer reflection film (280 nm thick) including 40 molybdenum (Mo) layers and 40 silicon (Si) layers that were laminated alternately were formed on one main surface of the substrate. Further, a protection film (2.5 nm thick) composed of a material containing ruthenium as a main component was formed on the multilayer reflection film.

Next, defect inspection was conducted to the substrate on which the multilayer reflection film and protection film were formed by the inspection tool shown in FIG. 6. First, origin point (x=0, y=0) for a two-dimensional x-y coordinate was set at the central portion of the other main surface of the substrate. Next, before defect inspection of the multilayer reflection film and protection film, a warpage or deflection of the substrate was measured as a flatness by function for adjusting focus of an optical system for detection of the coordinate reference mark. As a result, it was found that the center of the substrate was warped upward compared to the outer periphery of the substrate. The measured substrate had a length L of 106 mm and a height H of 400 nm, respectively, which are indicated in FIG. 7. Thus, the radius of curvature R of the warpage was $1.4045 \times 10^7$ mm.

In this defect inspection, first, a phase defect in the multilayer reflection film was inspected, and the position of the defect was obtained on the two-dimensional x-y coordinate of the other main surface. The position of the defect was corrected with the radius of curvature R that had been obtained to modify the warpage or deflection of the substrate, and the positional information of the defect was saved into a recording medium along with information of the detected signal level of the defect. Next, after inspecting the multilayer reflection film within the whole of the predetermined area, a priority for processing was determined in accordance with information of the defect stored in the recording medium, and the priority was also saved into the recording medium.

Next, an absorber film (70 nm thick) composed of a material containing tantrum (Ta) as a main component was formed on the protection film.

Next, defect inspection was conducted to the substrate on which the absorber film was formed by the inspection tool shown in FIG. 6. First, before defect inspection of the absorber film, a warpage or deflection of the substrate was measured as a flatness by function for adjusting focus of an optical system for detection of the coordinate reference mark. As a result, it was found that the center of the substrate was warped upward compared to the outer periphery of the substrate. The measured substrate had a length L of 106 mm and a height H of 550 nm, respectively, which are indicated in FIG. 7. Thus, the radius of curvature R of the warpage was $1.0214 \times 10^7$ mm.

In this defect inspection, first, a phase defect in the absorber film was inspected, and the position of the defect was obtained on the two-dimensional x-y coordinate of the other main surface. The position of the defect was corrected with the radius of curvature R that had been obtained to modify the warpage or deflection of the substrate, and the positional information of the defect was saved into a recording medium along with information of the detected signal level of the defect. By the method, a reflective mask blank was obtained.

Next, a reflective mask was manufactured in accordance with procedure in the flow chart described in FIG. 9. First, a set of the reflective mask blank as a main component and the recording medium was prepared, an electron beam resist was coated on the surface of the blank, then, the blank was mounted on the mask stage of an electron beam drawing tool. Next, coordinate positions of the defects stored in the recording medium were determined with reference to coordinate reference marks. Next, a drawing pattern data for the absorber film was prepared, drawing position of the absorber pattern was optimized so as to cover the maximum number of defects in accordance with the priority stored in the recording medium. Then, the optimally arranged drawing pattern was drawn to the electron beam resist as the absorber pattern, and the absorber pattern was formed by the usual manner.

In this case, since the manufacturing from the reflective mask blank to the reflective mask was conducted by using the coordinate reference marks formed on the other main surface of the substrate in common, position of the defect was determined with high accuracy. Thus, the error of position detection was within 10 nm.

Comparative Example 1

After the conductive film as the same in Example 1 was form on the other main surface of a substrate, the coordinate reference marks as same the in Example 1 was formed on the one main surface of the substrate by an ordinary lithography method without forming the coordinate reference marks in the conductive film. Next, the multilayer reflection film, protection film and absorber film as the same as in Example 1 were formed on the one main surface of the substrate, then, a reflective mask blank was obtained. The measurements of a flatness (modifications of warpage or deflection) and the defect inspection in manufacturing of the reflective mask blank were conducted as same in Example 1. A reflective mask was manufactured from the resulting reflective mask blank by the same method in Example 1.

In this case, the films having the total thickness of about 280 nm were formed on the coordinate reference marks at the stage after forming the multilayer reflection film and protection film, and the films having the total thickness of about 350 nm were formed on the coordinate reference marks at the stage after further forming the absorber film. Since a resist film will be formed on the absorber film in manufacturing a reflective mask, position of the defect was determined with less accuracy compared to Example 1. Thus, the error of position detection of within 10 nm was not attained.

Japanese Patent Application No. 2019-166813 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of manufacturing a reflective mask blank comprising a substrate, and a multilayer reflection film for EUV light reflection, a protection film, and an absorber film for EUV light absorption formed on one main surface of the substrate in this order from the substrate side, and a conductive film formed on another main surface of the substrate, the method comprising the steps of:
   (A1) forming the conductive film on said another main surface,
   (A2) forming a coordinate reference mark on said another main surface side,
   (B1) forming the multilayer reflection film and protection film on said one main surface,
   (B2) inspecting a defect in the multilayer reflection film and protection film formed in the step (B1) by measuring a warpage or deflection of the substrate as a flatness by function for adjusting focus of an optical system for detection of the coordinate reference mark, obtaining position of the defect, and correcting the position of the defect, then, obtaining positional information of a detected defect on the basis of coordinates defined with reference to the coordinate reference mark, and saving the positional information into a recording medium,
   (C1) after the step (B2), forming the absorber film on the protection film, and
   (C2) inspecting a defect in the absorber film formed in the step (C1) by measuring a warpage or deflection of the substrate as a flatness by function for adjusting focus of an optical system for detection of the coordinate reference mark, obtaining position of the defect, and correcting the position of the defect, then, obtaining positional information of a detected defect on the basis of coordinates defined with reference to the coordinate reference mark, and saving the positional information into a recording medium.

2. The method of claim 1, wherein in the step (A2), the coordinate reference mark is formed on the conductive film formed in the step (A1).

3. The method of claim 1, wherein when defects are detected in the step (B2), the step (B2) comprises the steps of creating a processing sequence for the defects, and saving the processing sequence into the recording medium along with the positional information.

4. The method of claim 3, wherein the processing sequence is a priority for processing the defects, the priority determined on the basis of printability of the detected defects.

* * * * *